United States Patent
Tsuda et al.

(10) Patent No.: US 8,289,093 B2
(45) Date of Patent: Oct. 16, 2012

(54) VOLTAGE CONTROLLED OSCILLATOR

(75) Inventors: Toshimasa Tsuda, Sayama (JP);
Tatsunori Onzuka, Sayama (JP); Kenji Kawahata, Sayama (JP); Hiroshi Hoshigami, Sayama (JP); Ryouichi Fujiyama, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/924,417

(22) Filed: Sep. 27, 2010

(65) Prior Publication Data

US 2011/0080228 A1  Apr. 7, 2011

(30) Foreign Application Priority Data

Oct. 5, 2009  (JP) .................... 2009-231935

(51) Int. Cl.
*H03B 5/08* (2006.01)

(52) U.S. Cl. .............. 331/167; 331/116 R; 331/116 FE; 331/177 V

(58) Field of Classification Search ............. 331/177 V, 331/167, 107 SL, 117 R, 117 FE
See application file for complete search history.

(56) References Cited

U.S. PATENT DOCUMENTS

| | | | |
|---|---|---|---|
| 5,532,651 A | 7/1996 | Jager et al. | |
| 5,600,279 A | 2/1997 | Mori | |
| 6,018,282 A | 1/2000 | Tsuda | |
| 6,046,647 A | 4/2000 | Nelson | |
| 6,072,371 A | 6/2000 | Kobayashi et al. | |
| 6,606,006 B1 | 8/2003 | Alexandersson | |
| 6,949,811 B2 | 9/2005 | Miyazawa | |
| 7,746,232 B2 | 6/2010 | Hashimoto | |
| 2003/0183864 A1 | 10/2003 | Miyazawa | |
| 2007/0205956 A1 | 9/2007 | Hashimoto | |
| 2010/0219927 A1 | 9/2010 | Hashimoto | |

FOREIGN PATENT DOCUMENTS

| | | |
|---|---|---|
| GB | 1 287 209 | 8/1972 |
| JP | 58-012315 | 1/1983 |
| JP | 62-162317 | 7/1987 |
| JP | 4-361407 | 12/1992 |
| JP | 7-131243 | 5/1995 |
| JP | 8-079069 | 3/1996 |

(Continued)

OTHER PUBLICATIONS

Peter Thoma: "Absolute calorimetric determination of dielectric loss factors at 2=10 4 s-1 and 4.2 k and application to the measurement of loss factors of standard capacitors at room temperature", IEEE Transactions on Instrumentation and Measurement, IEEE Service Center, Piscataway, NJ, US, vol. 15, No. 4, Dec. 1, 1980, pp. 328-330, XP011246154, ISSN: 0018-9456.

(Continued)

*Primary Examiner* — Arnold Kinkead
(74) *Attorney, Agent, or Firm* — Jordan and Hamburg LLP

(57) ABSTRACT

To provide a voltage controlled oscillator capable of being treated as a lumped constant circuit, having small size and capable of obtaining an oscillation frequency in a high frequency band. A resonance part in a voltage controlled oscillator has variable capacitance elements whose electrostatic capacitance varies in accordance with a control voltage for frequency control input from the outside and an inductance element, an amplifying part amplifies a frequency signal from the resonance part, and a feedback part, having feedback capacitance elements, forms an oscillation loop together with the amplifying part and the resonance part by making the frequency signal amplified in the amplifying part to be fed back to the resonance part. Further, the resonance part and the feedback part are provided on a quartz-crystal substrate.

3 Claims, 11 Drawing Sheets

FOREIGN PATENT DOCUMENTS

| | | |
|---|---|---|
| JP | 10-209714 | 8/1998 |
| JP | 10-215119 | 8/1998 |
| JP | 2000-183647 | 6/2000 |
| JP | 2000-312115 | 11/2000 |
| JP | 2001-223529 | 8/2001 |
| JP | 2001-339240 | 12/2001 |
| JP | 2003-297927 | 10/2003 |
| JP | 2005-072154 | 3/2005 |
| JP | 2007-036822 | 2/2007 |
| JP | 2007-201772 | 8/2007 |
| JP | 2007-235034 | 9/2007 |

OTHER PUBLICATIONS

U.S. Appl. No. 12/924,515, filed Sep. 29, 2010, Yamakawa et al.
U.S. Appl. No. 12/924,467, filed Sep. 28, 2010, Yamakawa et al.
U.S. Appl. No. 12/924,468, filed Sep. 28, 2010, Onzuka et al.

PRIOR ART

US 8,289,093 B2

VOLTAGE CONTROLLED OSCILLATOR

BACKGROUND OF THE INVENTION

1. Field of the Invention

The present invention relates to a technique for forming a resonance part using an inductance element and a variable capacitance element, and a voltage controlled oscillator (VCO) using the resonance part.

2. Description of the Related Art

As shown in FIG. 13, for instance, a voltage controlled oscillator (VCO) includes a resonance part having a varicap diode VD whose electrostatic capacitance varies in accordance with a control voltage and an inductance element 11, and a feedback part 2 formed of a transistor 21 being an amplifying part and two capacitors C1, C2. In this example, a frequency signal resonated in the resonance part is amplified by the transistor 21, and is fed back to a series resonant circuit via the feedback part 2, thereby forming an oscillation loop. Note that 31 in FIG. 13 denotes a buffer amplifier that amplifies the frequency signal and outputs it to the outside. Further, 16, T3 and L denote an input terminal, an output terminal part and an inductance element, respectively. Although the illustration is omitted, the VCO is disposed on a base substrate made of ceramics such as LTCC (Low Temperature Co-fired Ceramics) using alumina ($Al_2O_3$) as a main component, for instance.

Here, if the VCO is used in a high frequency band of, for example, several GHz or several tens of GHz by increasing an oscillation frequency thereof, problems as follows occur. Specifically, in a high frequency band, the VCO may become a distributed constant circuit in which a size of the substrate becomes larger than a wavelength of electrical signal processed (output) by the above-described VCO, and in such a case, there is a possibility such that signals whose amplitudes are reversed flow on the substrate, and these signals interfere with each other, which results in outputting no electrical signal, or the size of the substrate including the VCO has to be reduced to a size with which a practical manufacturing becomes difficult.

For instance, the VCO is disposed on a not-shown base substrate made of ceramics such as LTCC using alumina ($Al_2O_3$) as a main component. The LTCC has a relative dielectric constant $\in$ of about 9 to 10, for example, so that an apparent wavelength of electrical signal propagating on the substrate becomes shorter than an actual wavelength. Accordingly, in order to suppress the interference of electrical signals, it is preferable to reduce a size of the substrate to, for example, about 1/10 of the wavelength of the electrical signal, but, in reality, it is difficult to form electric circuits or is mount electronic components on a substrate with such a size.

Furthermore, in a VCO mounted in a radio communication device that outputs an electrical signal with a quite high frequency, which is, for example, an electrical signal in a GHz band (microwave), it is conceivable that a) an output signal of the VCO outputting a signal having a frequency lower than the frequency band is multiplied, b) GaAs (gallium arsenide compound) or the like is used as a base substrate, and c) a cavity resonator is used. However, in the case of a), a phase noise becomes large since a multiplication circuit is used. Further, in the case of b), the cost is increased, and in the case of c), the size is large so that it becomes difficult to realize the downsizing.

Although Patent Document 1 describes a device such as the above-described VCO, no study has been made regarding the aforementioned problems. Further, according to Patent Document 2, there is known a technique for making a quartz crystal being a piezoelectric substrate generate an elastic wave to use the quartz crystal as a resonator whose oscillation frequency is in about several MHz band, for instance, but, it is not possible to solve the above-described problems.

[Patent Document 1] Japanese Patent Application Laid-open No. Hei 10-209714

[Patent Document 2] Japanese Patent Application Laid-open No. 2007-201772

SUMMARY OF THE INVENTION

The present invention has been made based on such circumstances, and an object thereof is to provide a voltage controlled oscillator capable of being treated as a lumped constant circuit, having small size and capable of obtaining an oscillation frequency in a high frequency band.

A voltage controlled oscillator according to the present invention includes: a resonance part having a variable capacitance element whose electrostatic capacitance varies in accordance with a control voltage for frequency control input from the outside and an inductance element, and in which a series resonance frequency is adjusted in accordance with the electrostatic capacitance; an amplifying part amplifying a frequency signal from the resonance part; and a feedback part having a feedback capacitance element and forming an oscillation loop together with the amplifying part and the resonance part by making the frequency signal amplified in the amplifying part to be fed back to the resonance part, in which the resonance part and the feedback part are provided on a quartz-crystal substrate.

The voltage controlled oscillator may also include the following characteristics.

(a) The inductance element in the resonance part is a conductive path formed on the quartz-crystal substrate.

(b) The resonance part has the variable capacitance element and a capacitance element whose capacitance is not varied by the voltage, and the capacitance element is formed of a pair of comb-like conductive paths which intersect with a space therebetween.

(c) The feedback part has the feedback capacitance element, and the feedback capacitance element is formed of a pair of comb-like conductive paths which intersect with a space therebetween.

(d) A peripheral component is further provided on the quartz-crystal substrate.

(e) The series resonance frequency is 5 GHz or more.

According to the present invention, a voltage controlled oscillator is formed by providing a resonance part and a feedback part on a quartz-crystal substrate whose relative dielectric constant $\in$ is small to be about 4.0, so that even when the voltage controlled oscillator is formed on a substrate which is larger than a substrate made of ceramics, for instance, the oscillator can be treated as a lumped constant circuit, which enables a frequency signal in a high frequency band of, for example, several GHz or several tens of GHz to be stably oscillated.

DETAILED DESCRIPTION OF THE PREFERRED EMBODIMENT(S)

Figure 1:
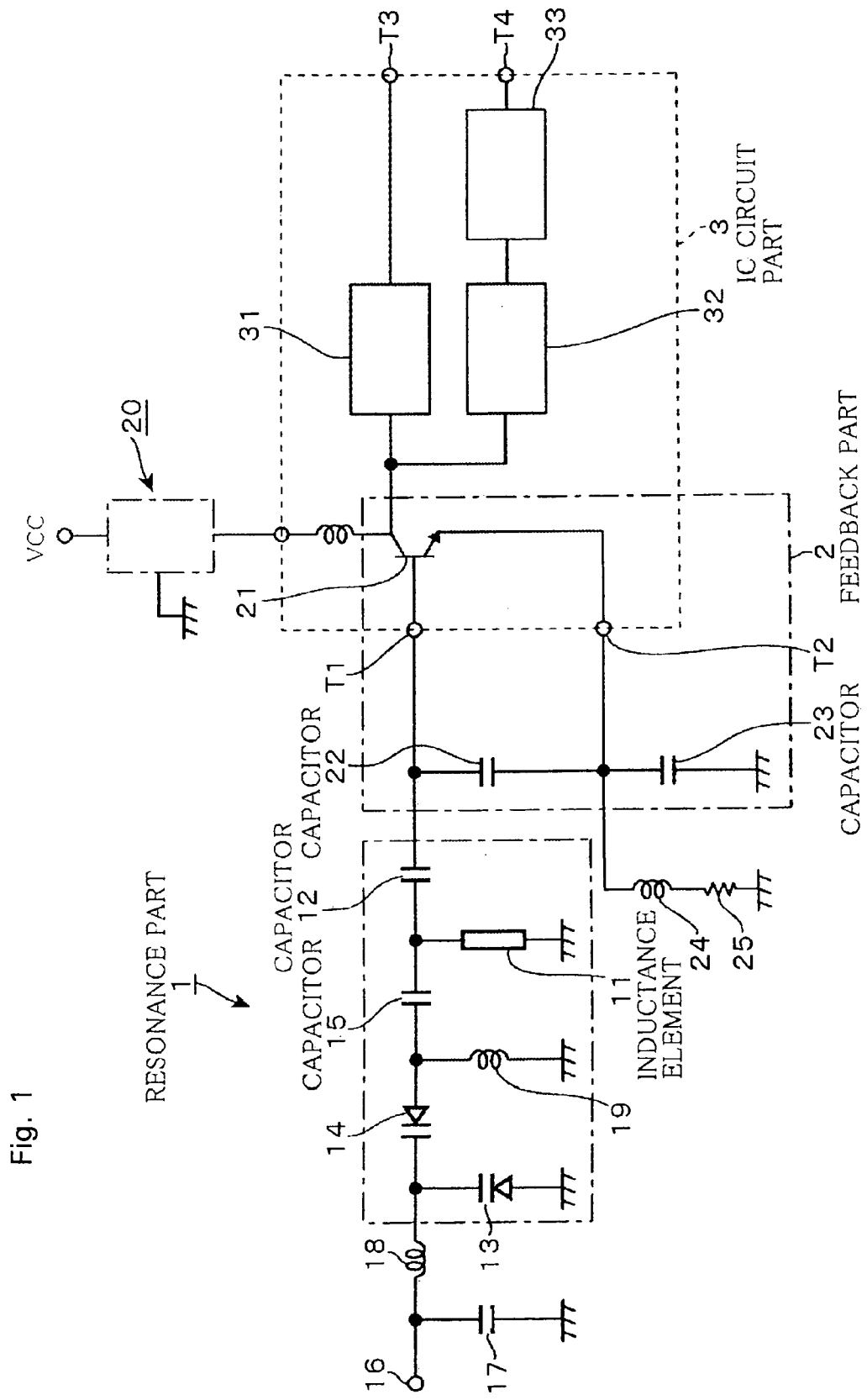
FIG. 1 is a circuit diagram showing a VCO as an example of an embodiment of an electric circuit of the present invention.

Before describing a structure of an embodiment of a voltage controlled oscillator (VCO) of the present invention, a circuitry of the embodiment will be described with reference to FIG. 1. In FIG. 1, 1 denotes a resonance part, and the resonance part 1 is provided with a series circuit for series resonance including an inductance element 11 formed of a conductive line 48 as will be described later and a capacitor 12 being a capacitance element. A series circuit formed of a first varicap diode 13, a second varicap diode 14 and a capacitor 15 being a capacitance element is connected in parallel with the inductance element 11, which forms a parallel circuit for parallel resonance. Specifically, the resonance part 1 has a series resonance frequency (resonance point) of the series circuit and a parallel resonance frequency (antiresonance point) of the parallel circuit, and an oscillation frequency is determined by a frequency of the resonance point. In this example, a constant of each circuit element is set so that the resonance point becomes greater than the antiresonance point, and by providing the antiresonance point as above, a frequency characteristic in the vicinity of the resonance point becomes steep.

Further, in FIG. 1, 16 denotes an input terminal for control voltage, and by a control voltage supplied to the input terminal 16, capacitance values of the first varicap diode 13 and the second varicap diode 14 are adjusted. Accordingly, the antiresonance point of the parallel circuit is shifted, and as a result of this, the resonance point is also shifted, which results in adjusting the oscillation frequency. The reason why the second varicap diode 14 is used in addition to the first varicap diode 13 is to secure a large span of adjustable range of frequency. 17 denotes a capacitor for voltage stabilization, and 18, 19 are bias inductors.

Further, a feedback part 2 is provided on a rear stage side of the resonance part 1, and the feedback part 2 includes an NPN-type transistor 21 serving as an amplifying part and having its base connected to the capacitor 12, and a series circuit of capacitors 22, 23 serving as feedback capacitance elements and connected between a connection point between the capacitor 12 and the base of the transistor 21 and a ground. An emitter of the transistor 21 is connected to a connection point between the capacitors 22 and 23, and grounded via an inductance 24 and a resistance 25. The transistor 21 is provided in a chip of an IC circuit part (LSI) 3 indicated by a dotted line, and the base and the emitter of the transistor 21 are respectively connected to both ends of the capacitor 22 via terminal parts (electrodes) T1, T2 of the chip.

In the circuit according to the present example, when the control voltage is input into the input terminal 16 from the outside, oscillation is made at a frequency of the resonance point, which is, for example, 10 GHz, by an oscillation loop formed of the resonance part 1 and the feedback part 2.

In the IC circuit part 3, there are provided two buffer amplifiers 31, 32 connected in parallel with each other to a collector of the transistor 21, for example, in which it is structured such that an oscillation output (signal of oscillation frequency) is taken out from one buffer amplifier 31 via a terminal part T3, and an oscillation output is taken out from the other buffer amplifier 32 via a frequency dividing circuit 33 and a terminal part T4.

Note that the resonance part 1 may also have a circuitry in which the varicap diode and the inductance element 11 are serially connected and an oscillation frequency is determined by a series resonance frequency of the series circuit, and in this case, the varicap diode also serves as the capacitance element in the resonance part 1 in "WHAT IS CLAIMED IS" in the present invention.

Next, a concrete overview of the VCO and a layout of the above-described resonance part 1 and the feedback part 2 as well as the circuit part 3 will be described with reference to FIG. 2 to FIG. 5. The VCO is formed on, for instance, an AT-cut quartz-crystal substrate 5, and on the quartz-crystal substrate 5, there are disposed electronic components formed of a later-described circuit part on substrate 10 including the resonance part 1 and the capacitors 22, 23 in the feedback part 2 and the IC circuit part 3 as well as a peripheral component and the like.

Figure 5:
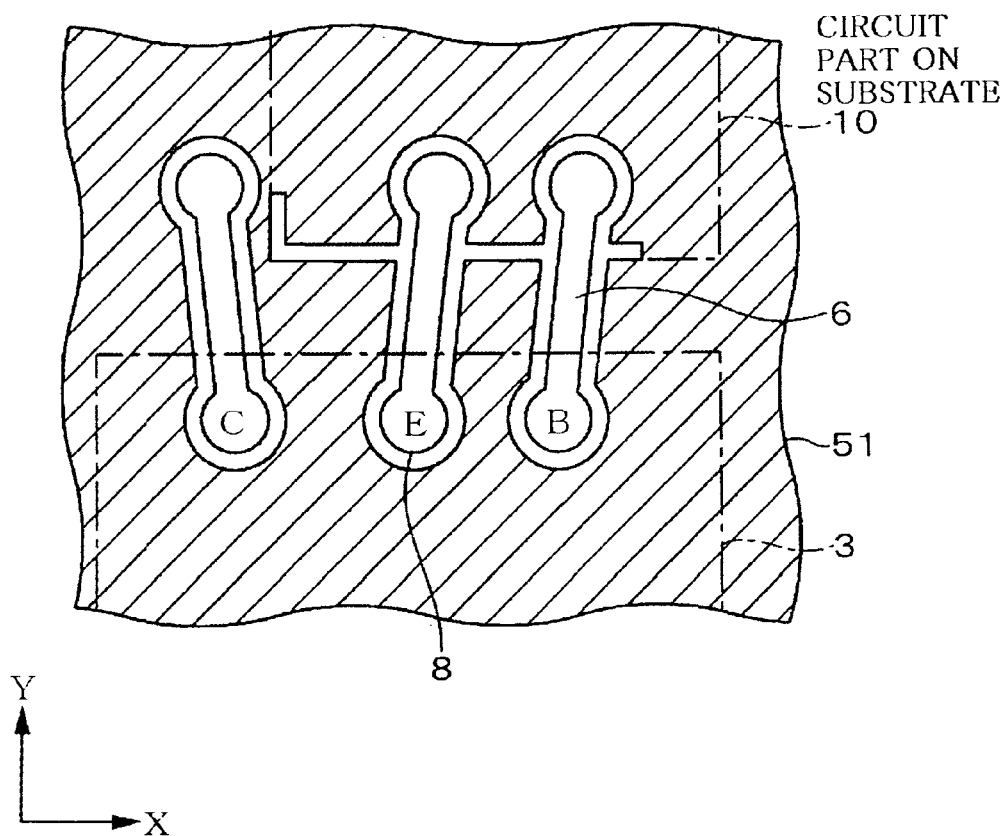
FIG. 5 is an enlarged plan view showing the above-described VCO.

On the quartz-crystal substrate 5, there is formed a coplanar line having a ground electrode 51 and conductive lines 6 for electrically connecting the above-described respective electronic components on the quartz-crystal substrate 5 and formed of a metal film in which, for example, Cr (chromium) and Cu (copper) are laminated in this order from the bottom, in which these ground electrode 51 and conductive lines 6 are disposed to be separated from each other, as shown in FIG. 5. Note that a part of an area on the quartz-crystal substrate 5 is cut out and enlarged to be illustrated in FIG. 5, in which hatching is provided in an area corresponding to the ground electrode 51 and the later-described circuit part on substrate 10. Further, in FIG. 5, the conductive lines 6 respectively connected to connecting terminals 8 for the aforementioned base, emitter and collector of the transistor 21, among a plurality of connecting terminals 8 of the circuit part 3, are denoted by symbols of B, E and C, respectively.

Figure 3:
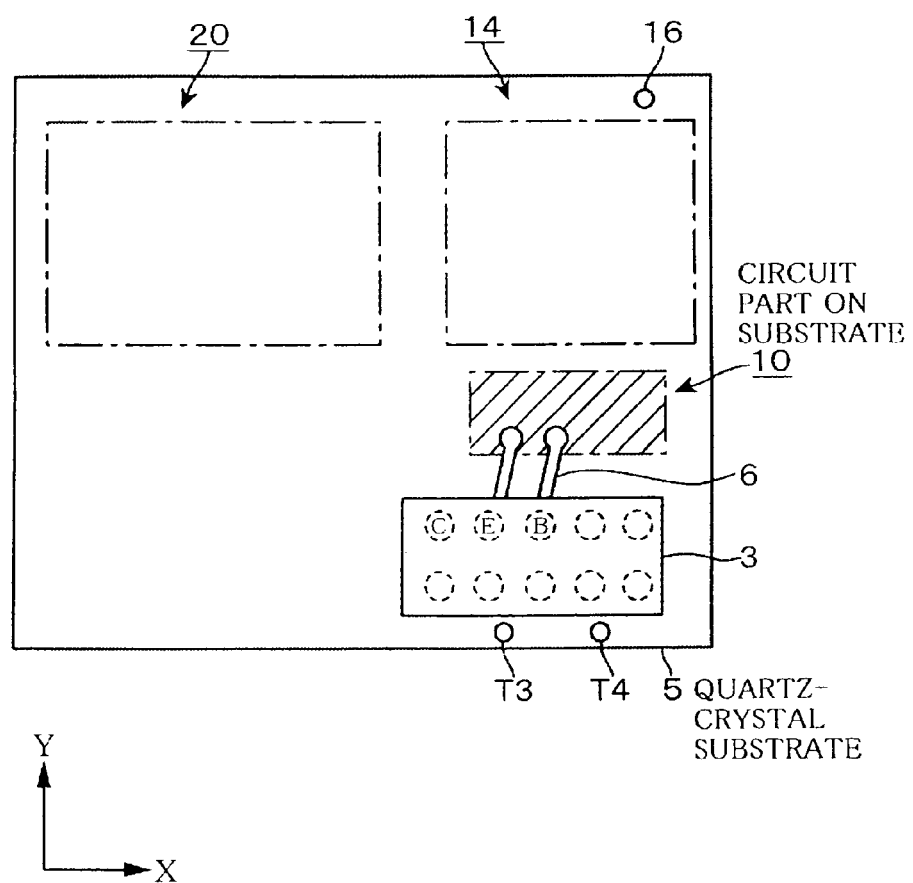
FIG. 3 is a plan view showing the above-described VCO.
Figure 4:
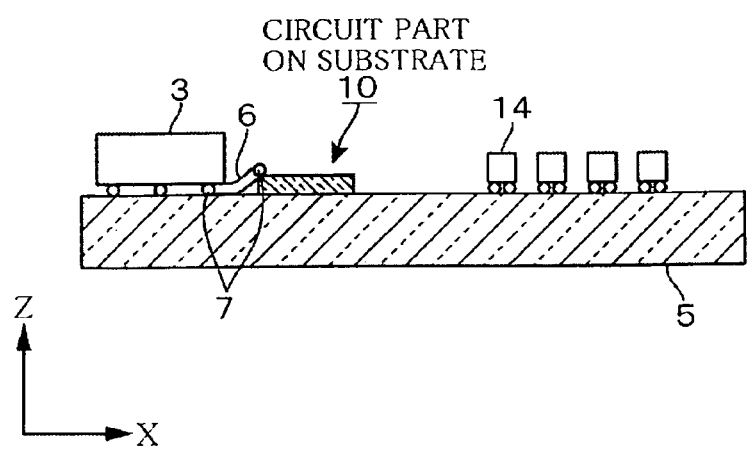
FIG. 4 is a side view showing the above-described VCO.

Among the above-described electronic components, the respective electronic components except the circuit part on substrate 10 are respectively fixed on the quartz-crystal substrate 5 by connecting parts 7 such as, for example, solder balls, and the respective connecting terminals 8 and the conductive lines 6 are electrically connected, as shown in FIG. 4. Further, although the illustration is omitted in FIG. 2 and the like, these electronic components are connected by the above-described conductive lines 6 routed around on the quartz-crystal substrate 5, thereby configuring an electric circuit that forms the VCO as shown in the aforementioned FIG. 1. In FIG. 3, 20 denotes a bias circuit for supplying a bias voltage to the transistor 21, and the bias circuit 20 is grounded. Note that the illustration of conductive lines 6 is omitted in FIG. 2, and further, FIG. 3 to FIG. 5 illustrate only a part of the conductive lines 6.

Figure 2:
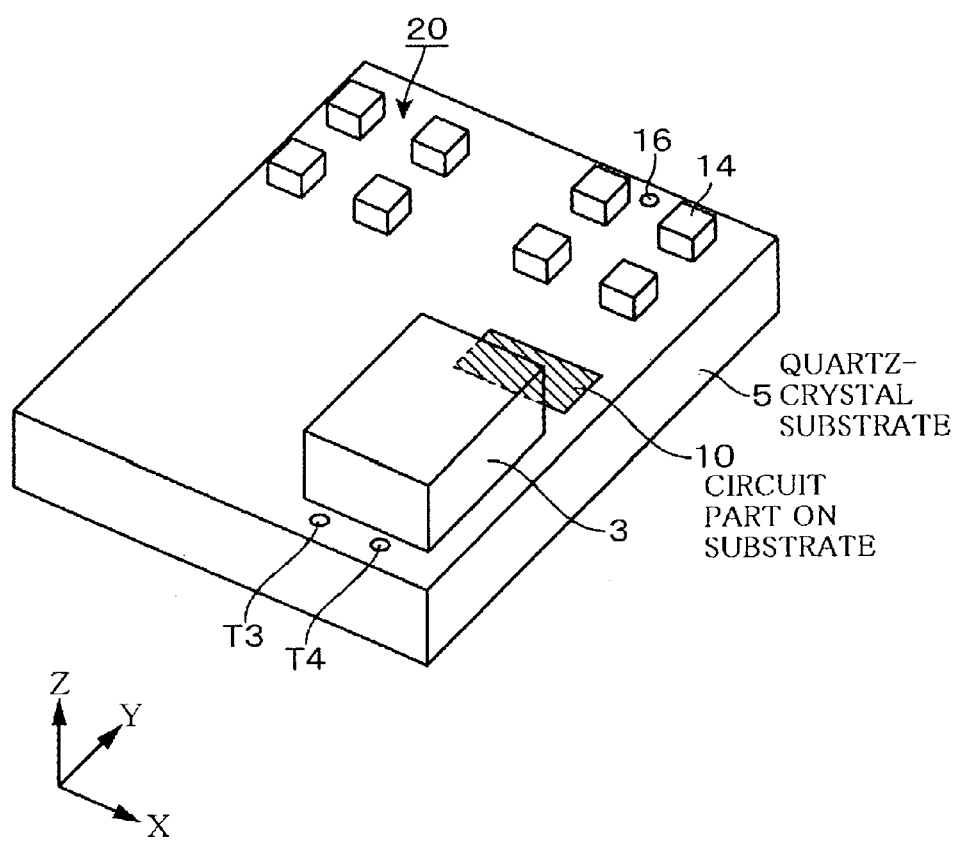
FIG. 2 is a perspective view showing an external appearance of the above-described VCO.
Figure 6:
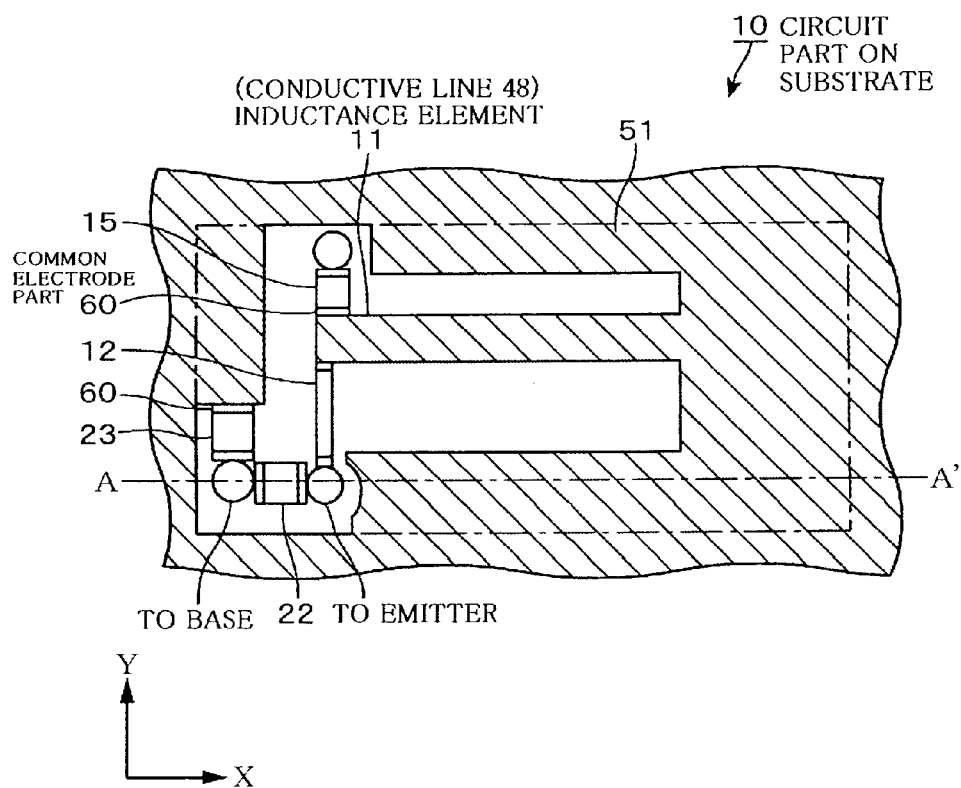
FIG. 6 is a plan view showing a circuit part on substrate of the above-described VCO.
Figure 7:
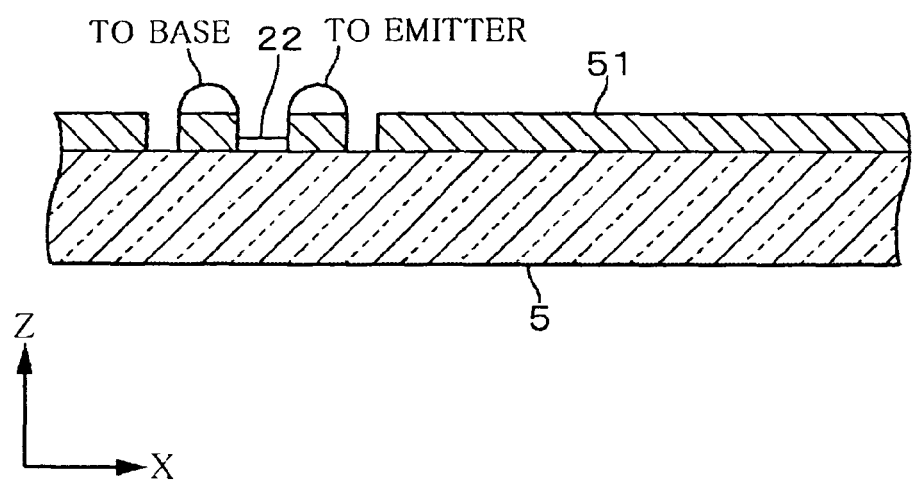
FIG. 7 is a side view showing the above-described circuit part on substrate.

As shown in FIG. 2 and FIG. 3 as well as FIG. 6 and FIG. 7, the inductance element 11, the capacitors 12, 15 in the above-described resonance part 1, and the capacitors 22, 23 in the feedback part 2 are directly formed, by photolithography or the like, within a predetermined area on an upper surface side, for example, of the quartz-crystal substrate 5 on which the electronic components such as the circuit part 3 and the varicap diode 14 are disposed. Hereinafter, if a circuit part including the inductance element 11, the capacitors 12, 15 in the resonance part 1 and the capacitors 22, 23 in the feedback part 2 and formed within the area is referred to as a circuit part on substrate 10, the circuit part on substrate 10 is also connected to the circuit part 3 or the like by the conductive lines 6 formed on the quartz-crystal substrate 5 as shown in FIG. 4, FIG. 5, for example, to thereby form the VCO.

For example, the quartz-crystal substrate 5 has a relative dielectric constants within a range of about 3 to 5, which is, for example, 4.0, and a loss of electric energy (dielectric loss tangent: tan $\delta$) which is about 0.00008. Therefore, a Q value of the quartz-crystal substrate 5 becomes about 12500 (=1/0.00008).

Although the illustration is simplified in FIG. 6, each of the capacitors 12, 15, 22, 23 forming the circuit part on substrate 10 is actually formed of a comb electrode including a pair of common electrode parts 60 formed to be parallel to each other, for example, and a group of electrode fingers (conductive paths) 61 extending in a comb-teeth shape from the respective common electrode parts 60 and intersecting with one another, and the respective common electrode parts 60 are connected to the connecting terminal 8 and the inductance element 11.

Meanwhile, the inductance element 11 in the resonance part 1 included in the circuit part on substrate 10 together with the above-described capacitors 12, 15, 22, 23 is formed as a strip line being a conductive line, as shown in FIG. 6, for instance. Further, as shown in FIG. 6, if an area, in the inductance element 11, sandwiched by the two capacitors 12 and 15 is set as one end side of the inductance element 11, the other end side of the inductance element 11 and the common electrode part 60, of the capacitor 23, on the opposite side of the common electrode part 60 connected to the emitter are connected to the ground electrode 51 formed on a surface of the quartz-crystal substrate 5.

Figure 8:
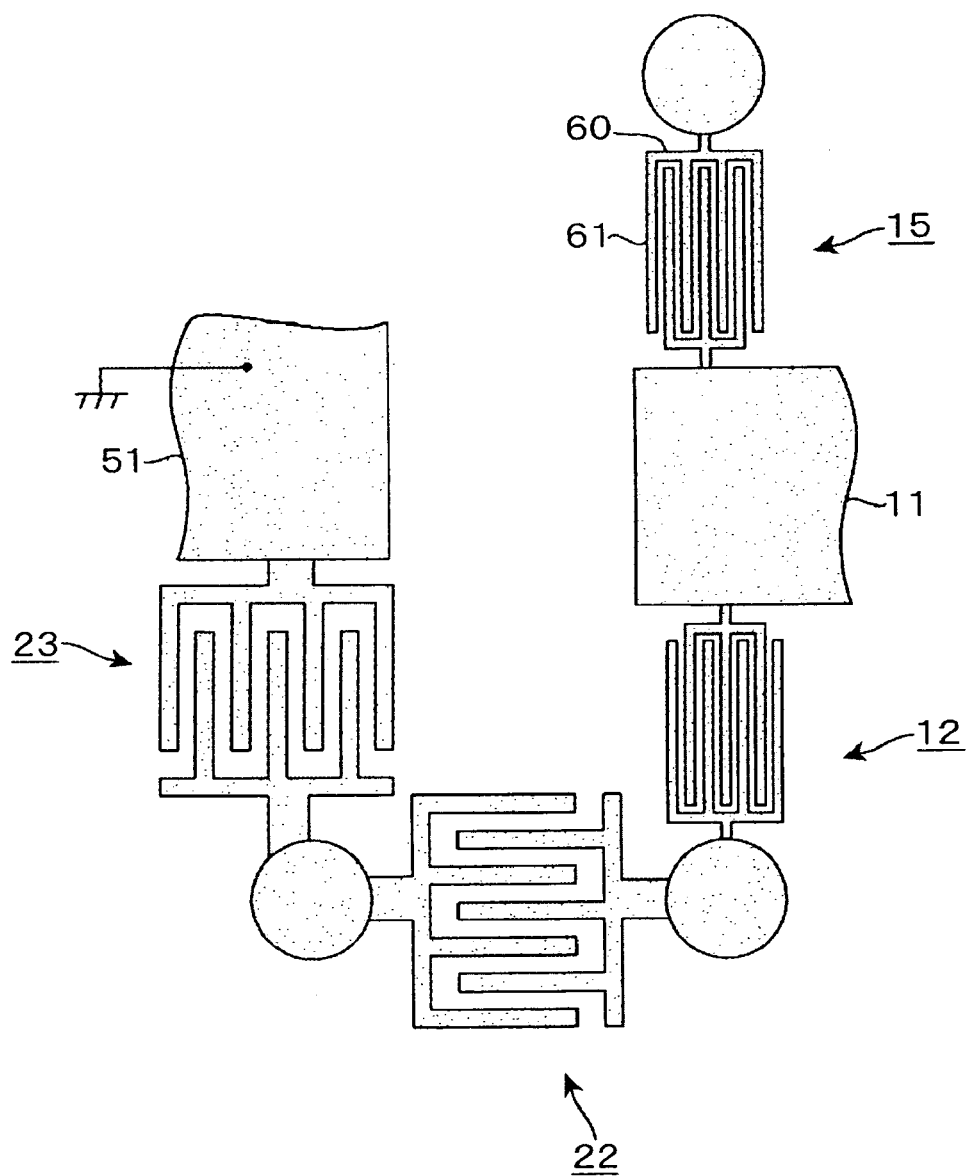
FIG. 8 is an enlarged plan view showing the above-described circuit part on substrate.

Here, FIG. 7 shows a vertical sectional side view in which the quartz-crystal substrate 5 is cut along A-A' line shown in FIG. 6, and FIG. 8 is a view showing a part of the circuit part on substrate 10 shown in FIG. 6 in an enlarged manner.

Figure 9:
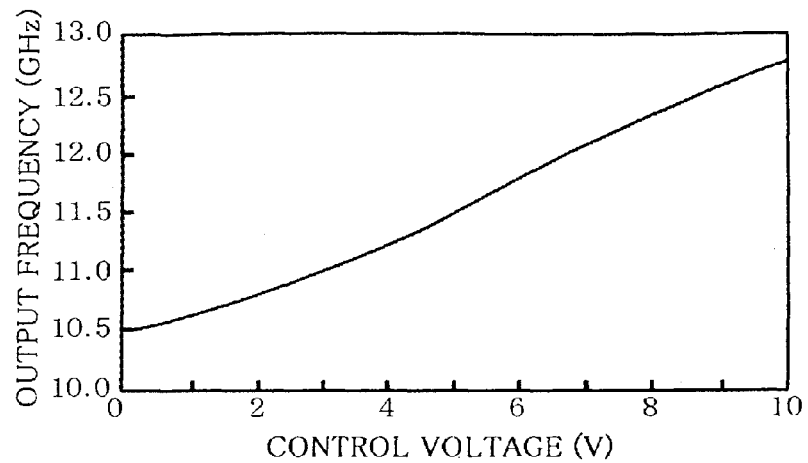
FIG. 9 is a characteristic diagram showing an output frequency characteristic obtained by the above-described VCO.
Figure 10:
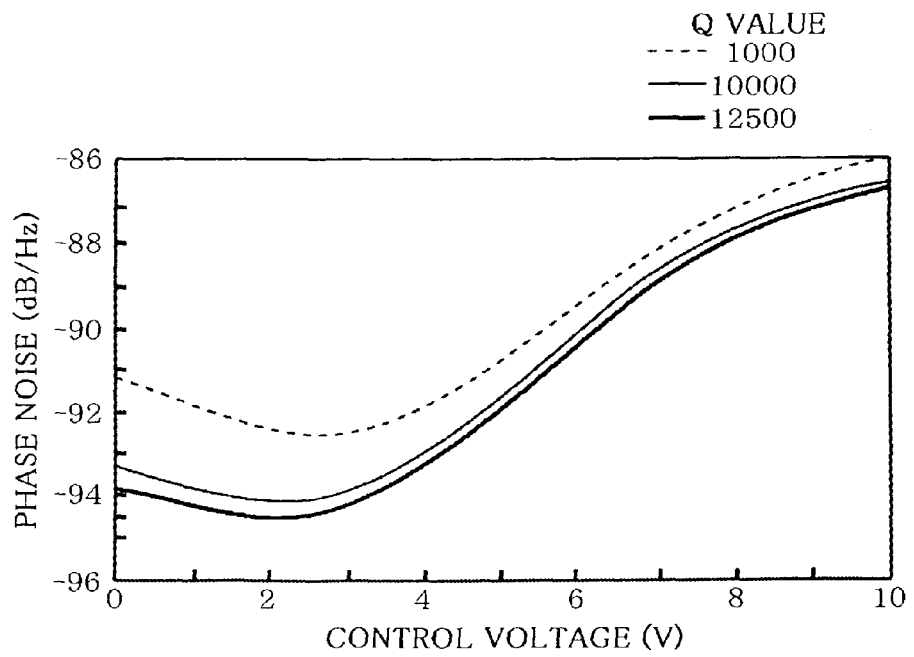
FIG. 10 is a characteristic diagram showing a phase noise characteristic obtained by the above-described VCO.

In the VCO, when a voltage for control (control voltage) is applied to the input terminal 16, oscillation is made at a frequency of the resonance point, which is, for example, 10 GHz, by the oscillation loop formed of the resonance part 1 and the feedback part 2 as described above, and a frequency signal corresponding to the oscillation frequency and a divided output of the frequency signal are taken out from the terminal part T3 and the terminal part T4, respectively. Here, at the time of the oscillation, the resonance part 1 has an inductivity. At this time, since the dielectric loss tangent of the quartz-crystal substrate 5 is quite small as described above and thus a high Q value is provided, when compared to a conventional substrate made of, for instance, fluorocarbon resin (Q value=1000), the quartz-crystal substrate 5 can reduce the phase noise to quite a low level over a wide frequency adjustment band. Specifically, a variable range of frequency in which a low phase noise characteristic can be obtained is wide. Results of simulations performed with respect to the VCO are shown in FIG. 9 and FIG. 10, in which it can be confirmed that it is possible to adjust an output frequency in a frequency band of GHz band in accordance with a control voltage, and further, it is possible to obtain a phase noise characteristic, which is better than a conventional characteristic, over a wide bandwidth. Note that FIG. 10 shows a phase noise at a position displaced by 10 kHz from the oscillation frequency. For reference, FIG. 10 additionally shows a characteristic of $Al_2O_3$ (HTCC: High Temperature Co-fired Ceramic, tan $\delta$=0.001, Q value=10000), for example. Further, FIG. 10 shows a result obtained by calculating a characteristic at the time of unloaded state (state where the inductance element 11 and the capacitors 12, 15, 22, 23 are not mounted on the quartz-crystal substrate 5).

Further, since the inductance element 11, the capacitors 12, 15 in the resonance part 1 and the capacitors 22, 23 in the feedback part 2 are formed on the quartz-crystal substrate 5 with a small relative dielectric constant as the circuit part on substrate 10, when compared to a case where the circuit part on substrate 10 is formed on the conventional LTCC, for instance, it is possible to increase an apparent wavelength of frequency signal oscillated by the circuit part on substrate 10.

For instance, a wavelength of a frequency signal of 10 GHz in a vacuum is about 3 cm, and meanwhile, a wavelength of the frequency signal in a dielectric has a value equal to a value obtained by dividing the wavelength in the vacuum by a value being one-half power of a relative dielectric constant of the dielectric, so that when a relative dielectric constant $\in$ of the quartz-crystal substrate 5 is 4.0, an apparent wavelength of the frequency signal becomes about 1.5 cm. Accordingly, as described in "DESCRIPTION OF THE RELATED ART", by forming the circuit part on substrate 10 within an area of about $1/10$ of the apparent wavelength of the frequency signal, namely, an area of about 1.5 mm to 2.0 mm, it becomes possible to treat the circuit part on substrate 10 as a lumped constant circuit. If an area of about 1.5 mm to 2.0 mm is provided, it is feasible to form the aforementioned comb-like electrodes and strip line formed of the conductive line by using photolithography, which enables to mass-produce the VCOs each having the quartz-crystal substrate 5 on which the circuit part on substrate 10 is formed, while suppressing the reduction of the yield and the like.

According to the above-described embodiment, since there is used the quartz-crystal substrate 5 having characteristics (relative dielectric constant $\in$, tan $\delta$ better than those of fluorocarbon resin, LTCC or the like conventionally used as a substrate of the inductance element 11 and the capacitor 12, and on which a fine pattern of metal film can be formed through a photolithography method, it is possible to obtain a low phase noise characteristic over a wide adjustment band. Further, by forming the inductance element 11, the capacitors 12, 15 in the resonance part 1 and the capacitors 22, 23 in the feedback part 2 (circuit part on substrate 10) on the quartz-crystal substrate, it becomes possible to treat the circuit part on substrate 10 as a lumped constant circuit and to make a frequency signal in a high frequency band of, for example, several GHz or several tens of GHz to be stably oscillated.

Further, since the inductance element 11, and the capacitors 12, 15, 22, 23 can be formed in one chip with the use of the photolithography method, it is possible to obtain the resonance part 1 and the VCO which are small size and durable to physical shock in an inexpensive manner. Further, by configuring the capacitors 12, 15, 22, 23 by the comb electrodes using the photolithography method as described above, large opposing areas (charge storage areas) of each of the electrode fingers 61, 61 can be provided, so that capacitors having small size and low loss can be easily obtained. Further, since the inductance element 11 and the capacitors 12, 15, 22, 23 can be directly formed on the quartz-crystal substrate 5, it is possible to shorten the routing of the electrode (conductive path), compared to a case where electronic components corresponding to these inductance element 11 and capacitors 12, 15, 22, 23 are mounted, for instance, and accordingly, it is possible to suppress the loss of electrical signal.

When an electric power value required for an actual operation, including that of a frequency divider, is checked in the VCO of the present invention, a voltage and a current are about 3.5 V and 75 mA, respectively. On the other hand, when a characteristic of VCO which uses conventional GaAs as a base substrate 5 is checked in the same manner, a voltage and a current are about 5 V and 300 mA, respectively. Therefore, it is confirmed that the VCO of the present invention can reduce power consumption more than the conventional VCO.

Here, a quartz crystal has been used as a piezoelectric element in a device utilizing an elastic wave, and the present invention focuses attention on excellent physical properties (tan δ and relative dielectric constant ∈) of the quartz crystal and a point such that a fine pattern of metal film can be formed on a surface of the quartz crystal with the use of the photolithography method, and forms the inductance element 11, the capacitors 12, 15 forming the resonance part 1 and the capacitors 22, 23 in the feedback part 2 on the quartz-crystal substrate 5. Further, the present example describes a configuration example in which on the quartz-crystal substrate 5 on which the circuit part on substrate 10 is formed, the other circuit part 3, varicap diode 14 and the like are disposed, but, these other circuits 3, 14 are not necessarily disposed on the quartz-crystal substrate 5. For instance, a case in which the respective elements (the inductance element 11, the capacitors 12, 15 in the resonance part 1, and the capacitors 22, 23 in the feedback part 2) included in the circuit part on substrate 10 shown in FIG. 6 to FIG. 8 are formed on a common quartz-crystal substrate to separately manufacture a quartz-crystal chip capable of being treated as a lumped constant circuit, and the quartz-crystal chip is disposed on a substrate made of, for example, fluorocarbon resin or LTCC on which the other circuit part 3, varicap diode 14 and the like are disposed, to thereby form the VCO, is also included in the technical scope of the present invention.

Further, each of the above-described capacitors 12, 15, 22, 23 may also be configured such that two electrode lines, for instance, instead of the comb electrode, are provided so as to face each other and an electric charge is accumulated between the lines, or a multilayer ceramic capacitor may also be used as the above-described capacitor.

Figure 11:
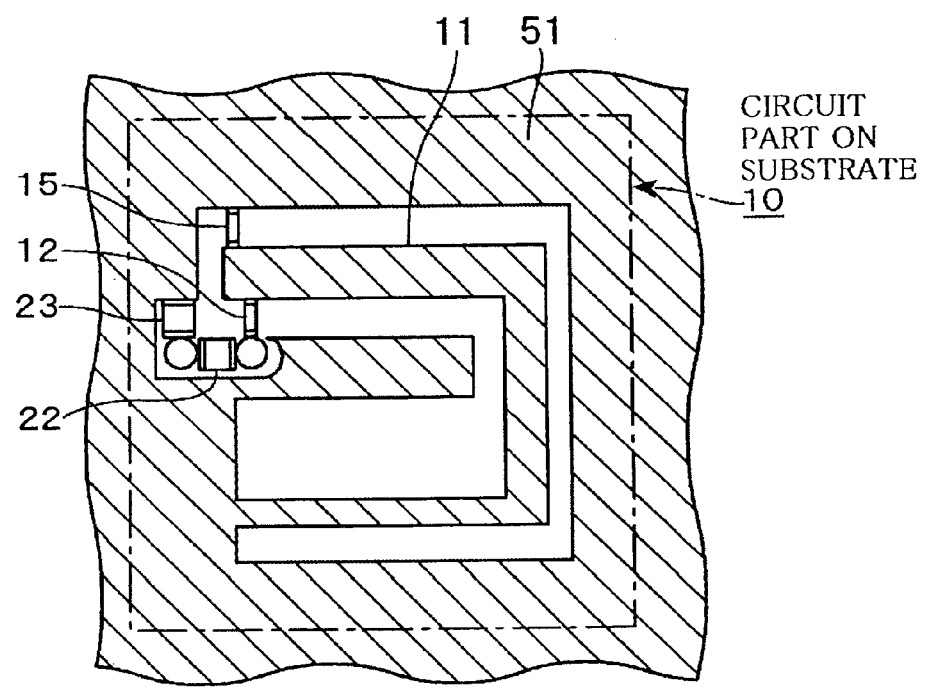
FIG. 11 is a plan view showing an another configuration example of the above-described circuit part on substrate.

Further, as a layout of the conductive line 48 on the quartz-crystal substrate 5, it is also possible that the inductance element 11 is routed around on the quartz-crystal substrate 5, as shown in FIG. 11, for example.

Further, as a material forming the conductive lines 6, the capacitors 12, 15, 22, 23, and the inductance element 11 on the quartz-crystal substrate 5, it is also possible to use at least one kind of Cu (copper), Au (gold), Cr (chromium), Ni (nickel), Ti (titanium), W (tungsten), V (vanadium), Ta (tantalum), Mo (molybdenum), Ag (silver), Pd (palladium), In (indium) and Sn (tin), for example, other than aluminum.

Figure 13:
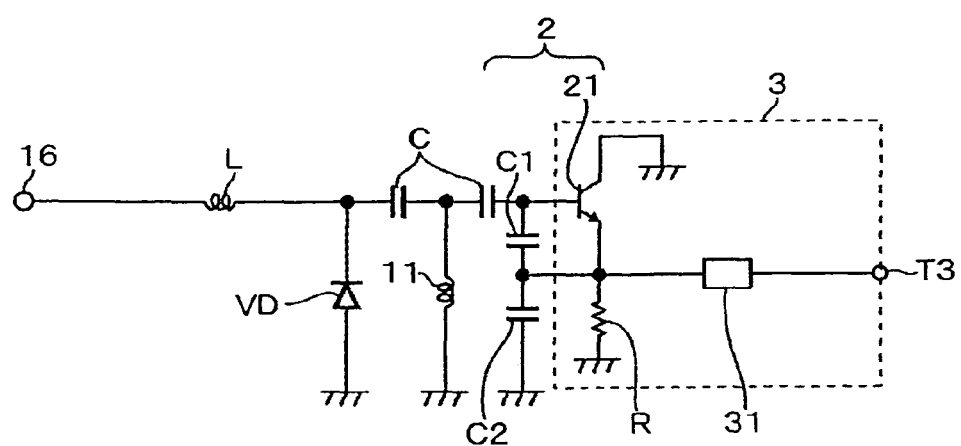
FIG. 13 is an electrical diagram showing a configuration of a conventional VCO.

Further, in the above-described example, the two varicap diodes 13, 14 are disposed, but, it is also possible to dispose one of them, and further, it is also possible to make one of these varicap diodes 13, 14 function as the capacitor 12, as shown in the aforementioned FIG. 13.

Figure 12:
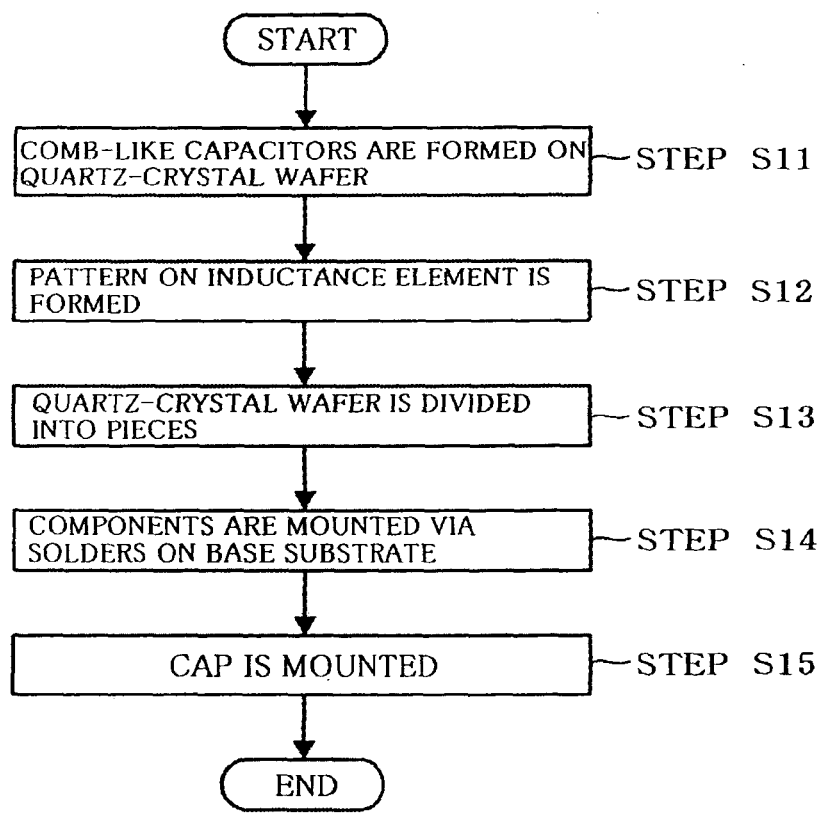
FIG. 12 is a flow diagram showing an example of a forming method of the above-described VCO.

Subsequently, an example of a method of manufacturing the above-described VCO will be described. First, a general outline of the manufacturing method will be described. As shown in FIG. 12, a large number of comb electrodes described above are formed, on a quartz-crystal wafer 40 having a diameter of 10 cm, for example, in a layout shown in the aforementioned FIG. 6 as the capacitors 12, 15, 22, 23 (step S11), and subsequently, the conductive line 48 is disposed on the quartz-crystal wafer 40 to form a pattern of the inductance element 11, thereby forming the circuit part on substrate 10 as well as forming the ground electrode 51 (step S12). Next, the quartz-crystal wafer 40 is cut by dicing or the like, for instance, so that the aforementioned quartz-crystal substrate 5 is divided into pieces (divided into chips) (step S13), and the components such as the IC circuit part 3 and the varicap diode 14 are mounted on the quartz-crystal substrate 5 via the solders (connecting parts 7) printed on the quartz-crystal substrate 5 having a wafer shape, for instance (step S14). Thereafter, a not-shown cap is mounted to cover the respective components on the quartz-crystal substrate 5 (step S15), thereby manufacturing the VCO.

What is claimed is:

1. A voltage controlled oscillator, comprising:
   a resonance part of no less than 5 GHz having a variable capacitance element whose electrostatic capacitance varies in accordance with a control voltage for frequency control input from the outside, a fixed capacitance element comprising a pair of comb-like conductive paths which intersect with a space therebetween and an inductance element comprising a conductive path, and in which a series resonance frequency is adjusted in accordance with the electrostatic capacitance;
   an amplifying part amplifying a frequency signal from said resonance part; and
   a feedback part having a fixed capacitance element for feedback comprising a pair of comb-like conductive paths which intersect with a space therebetween, and forming an oscillation loop together with said amplifying part and said resonance part by making the frequency signal amplified in said amplifying part to be fed back to said resonance part,
   wherein the fixed capacitance element and the inductance element of said resonance part and the fixed capacitance element for feedback of said feedback part are provided in a region of a size that is smaller than the size expressed by the following formula on the surface of a quartz-crystal substrate:
   (wavelength of frequency signal oscillated by said oscillation loop in a vacuum) divided by ($10* \in^{1/2}$) where ∈ is the relative dielectric constant.

2. The voltage controlled oscillator according to claim 1, wherein a peripheral component is further provided on the quartz-crystal substrate.

3. A voltage controlled oscillator, comprising:
   a resonance part of no less than 5 GHz having a variable capacitance element whose electrostatic capacitance varies in accordance with a control voltage for frequency control input from the outside, a fixed capacitance element comprising a pair of comb-like conductive paths which intersect with a space therebetween and an inductance element comprising a conductive path, and in which a series resonance frequency is adjusted in accordance with the electrostatic capacitance;
   an amplifying part amplifying a frequency signal from said resonance part; and
   a feedback part having a fixed capacitance element for feedback comprising a pair of comb-like conductive paths which intersect with a space therebetween, and forming an oscillation loop together with said amplifying part and said resonance part by making the frequency signal amplified in said amplifying part to be fed back to said resonance part,
   wherein the fixed capacitance element and the inductance element of said resonance part and the fixed capacitance element for feedback of said feedback part are provided on a quartz-crystal substrate and are effective as a lumped constant circuit for voltage controlled oscillation at a frequency at least 5 Ghz, said lumped constant circuit provided on said quartz-crystal substrate in a region of a size that is smaller than the size expressed by the following formula on the surface of a quartz-crystal substrate:

(wavelength of frequency signal oscillated by said oscillation loop in a vacuum) divided by $(10* \in^{1/2})$ where $\in$ is the relative dielectric constant.

* * * * *